United States Patent
Wu et al.

(10) Patent No.: US 10,095,068 B2
(45) Date of Patent: Oct. 9, 2018

(54) FLAT DISPLAY PANEL AND MANUFACTURING METHOD FOR THE SAME

(71) Applicant: Shenzhen China Star Optoelectronics Technology Co., Ltd., Shenzhen, Guangdong (CN)

(72) Inventors: Chuan Wu, Guangdong (CN); Jinjie Wang, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 468 days.

(21) Appl. No.: 14/768,001

(22) PCT Filed: Jun. 30, 2015

(86) PCT No.: PCT/CN2015/082821
§ 371 (c)(1),
(2) Date: Aug. 14, 2015

(87) PCT Pub. No.: WO2016/173113
PCT Pub. Date: Nov. 3, 2016

(65) Prior Publication Data
US 2017/0139255 A1 May 18, 2017

(30) Foreign Application Priority Data
Apr. 27, 2015 (CN) .......................... 2015 1 0204711

(51) Int. Cl.
*G02F 1/1339* (2006.01)
*G02F 1/1368* (2006.01)
(Continued)

(52) U.S. Cl.
CPC ........ *G02F 1/13394* (2013.01); *G02F 1/1368* (2013.01); *H01L 27/1248* (2013.01);
(Continued)

(58) Field of Classification Search
CPC .................................................... H01L 27/1248
(Continued)

(56) References Cited

U.S. PATENT DOCUMENTS

| 8,023,092 B2 | 9/2011 | Tatemori et al. |
| 8,797,495 B2 | 8/2014 | Hou et al. |

(Continued)

FOREIGN PATENT DOCUMENTS

| JP | 2007171715 A | 7/2007 |
| JP | 2008242035 A | 10/2008 |
| KR | 20070056318 A | 6/2007 |

*Primary Examiner* — Sue A Purvis
*Assistant Examiner* — Suberr Chi

(57) ABSTRACT

A flat display panel and manufacturing method are disclosed. The flat display panel includes a first substrate, a second substrate disposed oppositely to the first substrate. The second substrate is provided with a material layer having multiple concave slots. Multiple spacers are disposed on the first substrate and facing toward the second substrate. Wherein, multiple spacers include multiple main spacers and auxiliary spacers. The multiple auxiliary spacers respectively face toward regions which the multiple concave slots are located on, and the multiple main spacers respectively face toward regions which the multiple concave slots are not located on. A height of each main spacer and a height of each auxiliary spacer are the same such that when the flat display panel is not pressed, supporting the flat display panel through the main spacers, and when the flat display panel is pressed, further supporting the flat display panel through the auxiliary spacers.

7 Claims, 3 Drawing Sheets

(51) Int. Cl.
*H01L 27/12* (2006.01)
*G02F 1/1333* (2006.01)
*G02F 1/1362* (2006.01)

(52) U.S. Cl.
CPC ............... *H01L 27/1259* (2013.01); *G02F 2001/13396* (2013.01); *G02F 2001/13398* (2013.01); *G02F 2001/133302* (2013.01); *G02F 2001/136222* (2013.01)

(58) Field of Classification Search
USPC ........................................................ 349/155
See application file for complete search history.

(56) References Cited

U.S. PATENT DOCUMENTS

| | | | |
|---|---|---|---|
| 2008/0036958 A1* | 2/2008 | Su | G02F 1/13394 349/155 |
| 2010/0201934 A1* | 8/2010 | Fan | G02F 1/13394 349/153 |
| 2011/0013131 A1* | 1/2011 | Tanaka | G02F 1/133512 349/155 |
| 2013/0250228 A1 | 9/2013 | Lin et al. | |
| 2015/0268501 A1* | 9/2015 | Hao | G02F 1/13394 349/156 |

* cited by examiner

FLAT DISPLAY PANEL AND MANUFACTURING METHOD FOR THE SAME

BACKGROUND OF THE INVENTION

1. Field of the Invention

The present invention relates to a liquid crystal display technology field, and more particular to a flat display panel and a manufacturing for the same.

2. Description of Related Art

Between an upper substrate and a lower substrate of a liquid crystal panel, multiple main spacers having a higher height and multiple auxiliary spacers having a lower height are provided in order to maintain a distance between the upper substrate and the lower substrate of the liquid crystal panel so as to form a room for filling liquid crystal molecules.

In order to form the main spacers and auxiliary spacers having different heights, two methods are utilized: the first method is utilizing light intensity of a photomask to manufacture the spacers having different heights; the second method is utilizing etching technology to form the spacers having different heights. However, both two methods have drawbacks. For example, the cost of the first method is higher, and the second method is hard to precisely control a height difference between a main spacer and an auxiliary spacer. Besides, no fixing device is provided between the main spacers, the auxiliary spacers and the lower substrate, when the panel is deformed or bent, the upper substrate and the lower substrate are easily to slide relatively such that a light leakage of the liquid crystal panel is generated.

SUMMARY OF THE INVENTION

The main technology solved by the present invention is to provide a flat display panel and a manufacturing method for the same in order to simplify the manufacturing method and decrease the production cost.

In order to solve the above technology problem, a technology solution utilized by the present invention is to provide a flat display panel, comprising: a first substrate; a second substrate disposed oppositely to the first substrate, wherein, the second substrate is provided with a material layer, and multiple concave slots are disposed on the material layer; multiple spacers disposed on the first substrate and facing toward the second substrate in order to separate the first substrate and the second substrate; wherein, multiple spacers include multiple main spacers and multiple auxiliary spacers; the multiple auxiliary spacers respectively face toward regions of the material layer which the multiple concave slots are located on, and the multiple main spacers respectively face toward regions of the material layer which the multiple concave slots are not located on; a height of each main spacer and a height of each auxiliary spacer are the same such that when the flat display panel is not pressed, supporting the flat display panel through the main spacers, and when the flat display panel is pressed, further supporting the flat display panel through the auxiliary spacers; wherein, the first substrate is an opposite substrate, and the second substrate is a thin-film-transistor (TFT) array substrate; each spacer is made of an elastic material.

Wherein, the material layer is a color resist layer.

Wherein, one concave slot is provided at a location of the color resist layer corresponding to each sub-pixel.

Wherein, one concave slot is provided at a location of the color resist layer corresponding to multiple sub-pixels.

Wherein, a height of each concave slot is h1; h1 is equal to Δh; Δh is a height difference between a main spacer and an auxiliary spacer when the flat display panel is under a non-pressing status.

Wherein, a height of each multiple concave slots is h2, wherein, h2 is greater than Δh, Δh is a height difference between a main spacer and an auxiliary spacer when the flat display panel is under a non-pressing status.

In order to solve the above technology problem, a technology solution utilized by the present invention is to provide a flat display panel, comprising: a first substrate; a second substrate disposed oppositely to the first substrate, wherein, the second substrate is provided with a material layer, and multiple concave slots are disposed on the material layer; multiple spacers disposed on the first substrate and facing toward the second substrate in order to separate the first substrate and the second substrate; wherein, multiple spacers include multiple main spacers and multiple auxiliary spacers; the multiple auxiliary spacers respectively face toward regions of the material layer which the multiple concave slots are located on, and the multiple main spacers respectively face toward regions of the material layer which the multiple concave slots are not located on; a height of each main spacer and a height of each auxiliary spacer are the same such that when a flat display panel is not pressed, supporting the flat display panel through the main spacers, and when the flat display panel is pressed, further supporting the flat display panel through the auxiliary spacers.

Wherein, the first substrate is an opposite substrate, and the second substrate is a thin-film-transistor (TFT) array substrate.

Wherein, the material layer is a color resist layer.

Wherein, one concave slot is provided at a location of the color resist layer corresponding to each sub-pixel.

Wherein, one concave slot is provided at a location of the color resist layer corresponding to multiple sub-pixels.

Wherein, a height of each concave slot is h1; h1 is equal to Δh; Δh is a height difference between a main spacer and an auxiliary spacer when the flat display panel is under a non-pressing status.

Wherein, a height of each multiple concave slots is h2, wherein, h2 is greater than Δh, Δh is height difference between a main spacer and an auxiliary spacer when the flat display panel is under a non-pressing status.

In order to solve the above technology problem, a technology solution utilized by the present invention is to provide a manufacturing method for a flat display panel, comprising: providing a first substrate; forming multiple spacers on the first substrate, wherein, the multiple spacers include multiple main spacers and multiple auxiliary spacers, and a height of each main spacer and a height of each auxiliary spacer are the same; providing a glass substrate, and forming a material layer on a side of the glass substrate, and forming multiple concave slots at regions of the material layer corresponding to the multiple auxiliary spacers in order to form a second substrate; aligning and assembling the first substrate having multiple spacers with the second substrate such that the multiple auxiliary spacers respectively face toward regions of the material layer which the multiple concave slots are located on, and the multiple main spacers are respectively faced toward regions of the material layer which the multiple concave slots are not located on in order to form a flat display panel; wherein, when the flat display panel is not pressed, the flat display panel is supported by the main spacers, and when the flat display panel is pressed, the flat display panel is further supported through the auxiliary spacers.

Wherein, the first substrate is an opposite substrate, and the second substrate is a thin-film-transistor (TFT) array substrate.

Wherein, the material layer is a color resist layer.

The beneficial effects of the present invention are: Comparing to the prior art, in the present invention, the main spacers and the auxiliary spacers having a same height are disposed between the first substrate and the second substrate of the flat display panel, and multiple concave slots are disposed on the material layer of the second substrate. Wherein, the multiple auxiliary spacers respectively face toward regions of the material layer which the multiple concave slots are located on, and the multiple main spacers respectively face toward regions of the material layer which the multiple concave slots are not located on. Accordingly, when the flat display panel is not pressed, the flat display panel is supported by the main spacers, and when the flat display panel is pressed, the flat display panel is further supported through the auxiliary spacers. Through above way, the manufacturing process is simplified, the production cost is decreased. Besides, when the flat display panel is compressed, that is, the flat display panel is deformed and bent; the auxiliary spacers can be engaged and fixed in the concave slots such that the first substrate and the second substrate are not easily to slide relatively in order to avoid a light leakage of the flat display panel.

DETAILED DESCRIPTION OF THE PREFERRED EMBODIMENT

The following content combines figures and embodiments for detail description of the present invention.

Figure 1:
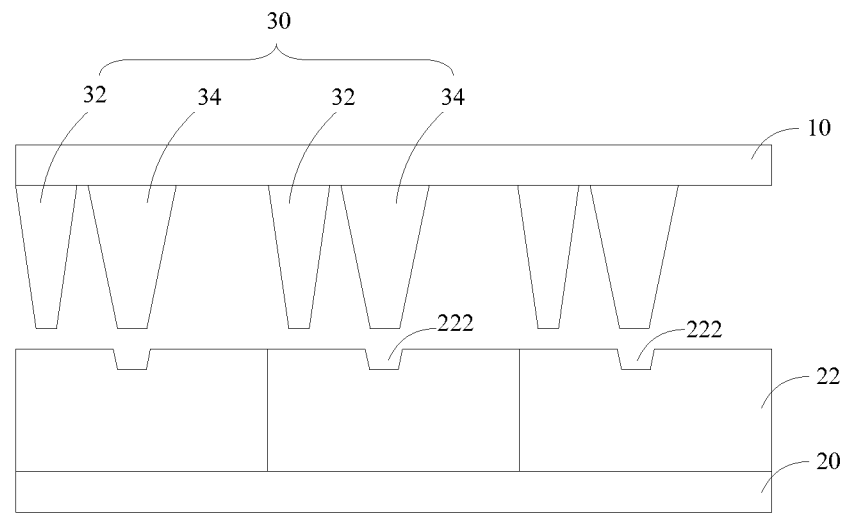
FIG. 1 is a cross-sectional view of a flat display panel according to an embodiment of the present invention.

With reference to FIG. 1, and FIG. 1 is a cross-sectional view of a flat display panel according to an embodiment of the present invention.

A flat display panel 100 includes a first substrate 10, a second substrate 20 and multiple spacers 30. The second substrate 20 is disposed oppositely to the first substrate 10. Each of the first substrate 10 and the second substrate 20 can be a glass substrate, an opposite substrate, a color filter substrate, a thin-film-transistor array substrate, or an integrated substrate that integrates a color filter substrate and a thin-film-transistor array.

Wherein, a material layer 22 is disposed on the second layer 20, and multiple concave slots 222 are disposed on the material layer 22. The material layer 22 can be various material layers such as a color resist layer or a common electrode layer which can be formed in the second substrate 20.

Multiple spacers 30 are disposed on the first substrate 10 and face toward the second substrate 20 in order to separate the first substrate 10 and the second substrate 20, and to maintain a distance between the first substrate 10 and the second substrate 20 so as to form a certain room for filling liquid crystal molecules. Each spacer 30 is made of various elastic materials such as an acrylic resin micro particle of a plastic material, a rod-shaped particle of a glass material or a spherical particle of a silicone material.

The multiple spacers 30 include multiple main spacers 32 and multiple auxiliary spacers 34. A height of each main spacer 32 and a height of each auxiliary spacer 34 are the same. It can be understood that each of the main spacers 32 and the auxiliary spacers 34 can be made of various elastic materials such as an acrylic resin micro particle of a plastic material, a rod-shaped particle of a glass material or a spherical particle of a silicone material.

The main spacers 32 respectively face toward regions of the material layer 22 which the multiple concave slots 222 are not located on.

When a flat display panel 100 is under a non-pressing status, the flat display panel 100 is supported through the main spacers 32. At this time, the main spacers 32 are under a compression status by a gravity force of the first substrate 10. The auxiliary spacers 34 is under a non-compression status, that is, a free status, because the concave slots of the material layer 22 on the second substrate 20 are corresponding to the auxiliary spacers 34.

When the flat display panel 100 is pressed, because the action of the pressure, the main spacers 32 are further compressed. At the same time, the auxiliary spacers 34 are respectively engaged and fixed in the multiple concave slots 222 on the material layer 22 such that the flat display panel 100 is further supported. At this time, the auxiliary spacers are under a compression status.

In the present invention, the main spacers and the auxiliary spacers having a same height are disposed between the first substrate and the second substrate of the flat display panel, and multiple concave slots are disposed on the material layer of the second substrate. Wherein, the multiple auxiliary spacers respectively face toward regions of the material layer which the multiple concave slots are located on, and the multiple main spacers respectively face toward regions of the material layer which the multiple concave slots are not located on. Accordingly, when the flat display panel is not pressed, the flat display panel is supported by the main spacers, and when the flat display panel is pressed, the flat display panel is further supported through the auxiliary spacers. Through above way, the manufacturing process is simplified, the production cost is decreased. Besides, when the flat display panel is compressed, that is the flat display panel is deformed and bent; the auxiliary spacers can be engaged and fixed in the concave slots such that the first substrate and the second substrate are not easily to slide relatively in order to avoid a light leakage of the flat display panel.

Furthermore, the first substrate 10 is an opposite substrate, and the second substrate 20 is a thin-film-transistor array substrate. Furthermore, the material layer 22 is a color resist layer.

Figure 2:
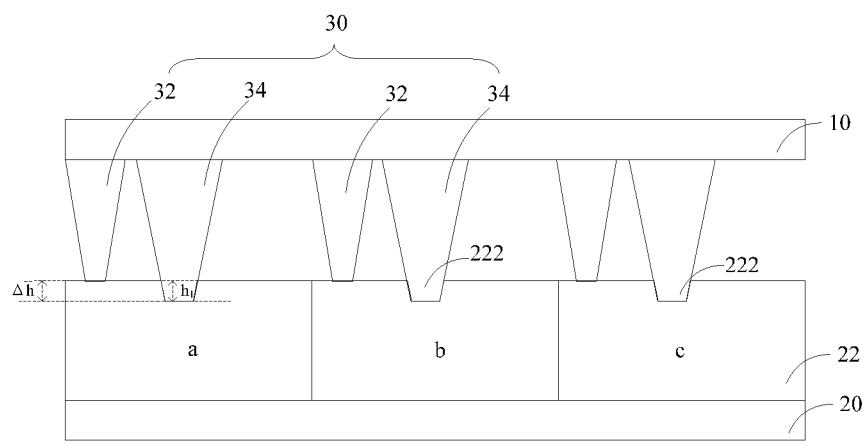
FIG. 2 is a cross-sectional view of a flat display panel under a pressing status according to an embodiment of the present invention.

Wherein, one concave slot 222 is provided at a location of the color resist layer 22 corresponding to each sub-pixel. Specifically, as shown in FIG. 2, FIG. 2 is a cross-sectional view of a flat display panel under a pressing status according to an embodiment of the present invention. Each of locations of the color resist layer 22 respectively correspond to a sub-pixel a, a sub-pixel b and a sub-pixel c is provided with one concave slot 222. Because the multiple auxiliary spacers 34 respectively face toward the multiple concave slots 222 on the material layer 22, a relationship of the auxiliary spacers and the color resist layer 22 is that one sub-pixel corresponds to one auxiliary spacer.

It can be understood that, in another embodiment, one concave slot 222 is provided at a location of the color resist layer corresponding to multiple sub-pixels. Because the multiple auxiliary spacers 34 respectively face toward the multiple concave slots 222 on the material layer 22, a relationship of the auxiliary spacers and the color resist layer 22 is that multiple sub-pixels correspond to one auxiliary spacer.

Furthermore, with reference to FIG. 2, a height of each concave slot is h1, wherein, h1 is equal to $\Delta h$, and $\Delta h$ is a height difference between a main spacer and an auxiliary spacer. Specifically, $\Delta h$ is a height difference between a main spacer under a compression status and an auxiliary spacer under a non-compression status when the flat display panel is under the non-pressing status.

Figure 3:
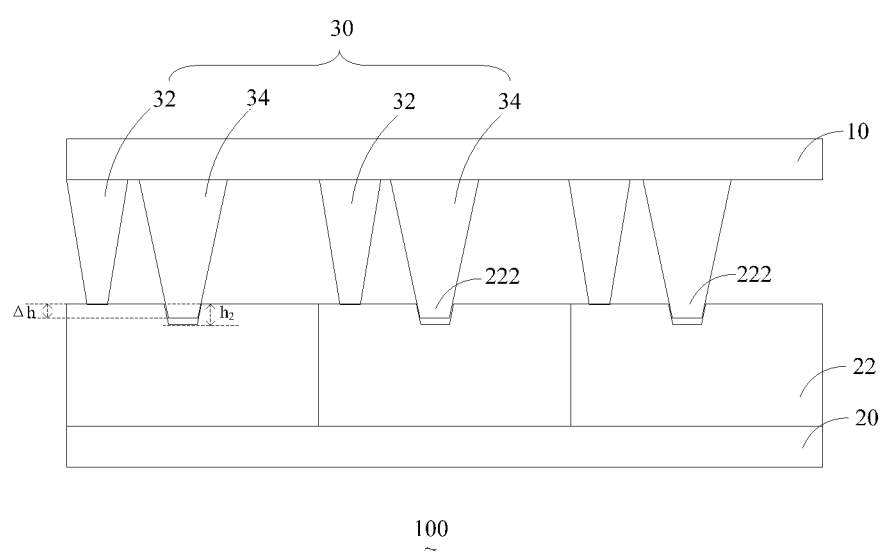
FIG. 3 is a cross-sectional view of a flat display panel under a pressing status according to another embodiment of the present invention.

It can be understood that in another embodiment, with reference to FIG. 3, FIG. 3 is a cross-sectional view of a flat display panel under a pressing status according to another embodiment of the present invention. A height of each concave slot is h2, wherein, h2 is greater than $\Delta h$; $\Delta h$ is a height difference between a main spacer and an auxiliary spacer when the flat display panel is under a non-pressing status.

The flat display panel of the present embodiment not only simplifies the manufacturing process but also decrease the production cost. Besides, one concave slot is provided at a location of the color resist layer corresponding to each sub-pixel such that a relationship of the auxiliary spacers and the color resist layer is that one sub-pixel corresponds to an auxiliary spacer. Through above method, a density of the auxiliary spacers formed on the first substrate is increased. when the flat display panel is pressed, that is the flat display panel is deformed or bent; more auxiliary spacers can be engaged and fixed in the concave slots of the material layer such that the first substrate and the second substrate are not easily to slide relatively in order to avoid a light leakage of the flat display panel.

Besides, a height of each concave slot is greater than or equal to $\Delta h$, through this way, the auxiliary spacers have a supporting function only when the flat display panel is under a pressing status so as to avoid that the auxiliary spacers are under a compression status when the flat display panel is under a non-pressing status. Accordingly, the life of the auxiliary spacers is extended so as to extend the life of the flat display panel.

Figure 4:
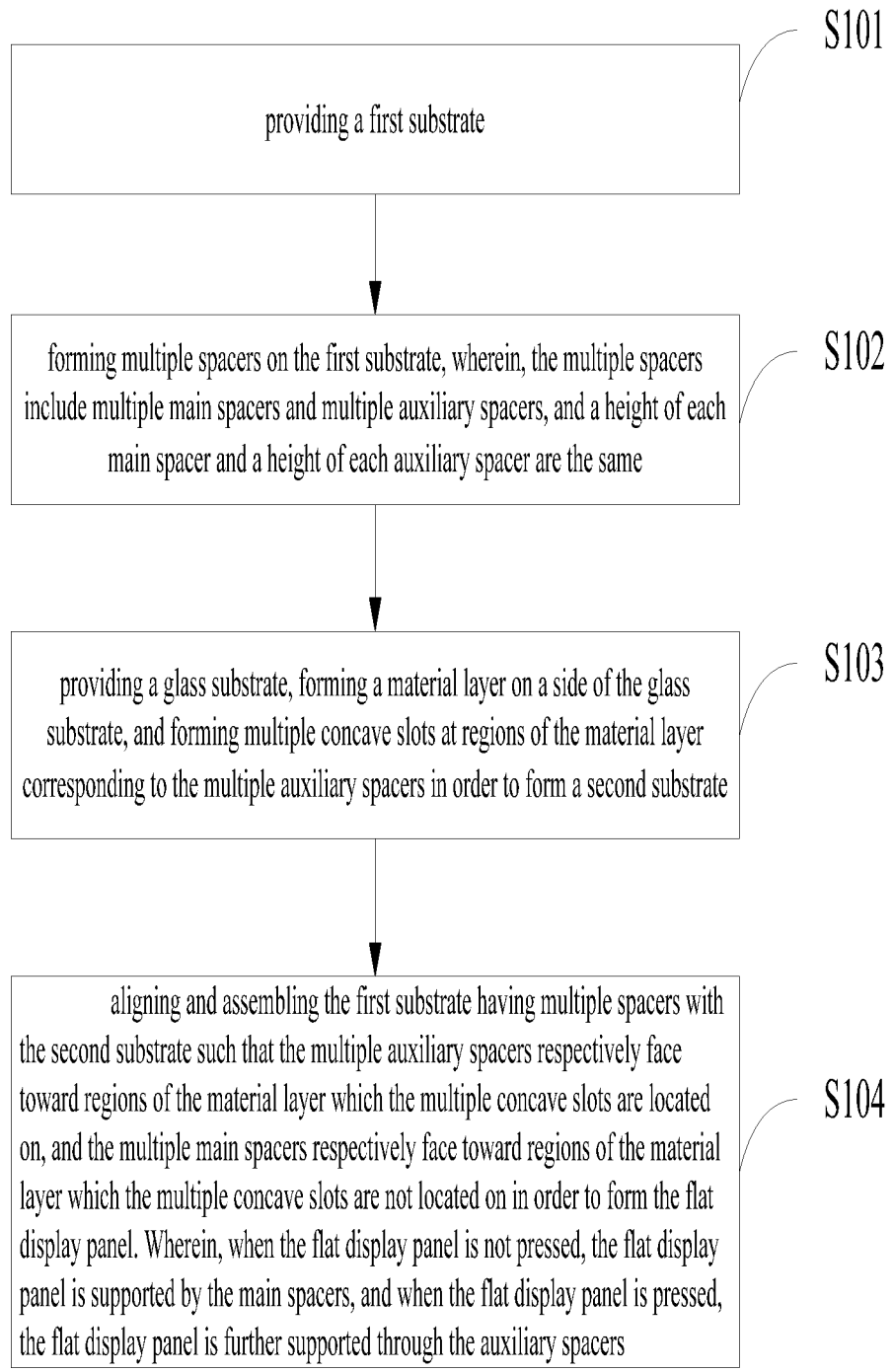
FIG. 4 is a flow chart of a manufacturing method for a flat display panel according to an embodiment of the present invention.

Besides, the present invention also provides a manufacturing method for a flat display panel. With reference to FIG. 4, FIG. 4 is a flow chart of a manufacturing method for a flat display panel according to an embodiment of the present invention. The manufacturing method includes following steps:

S101: providing a first substrate.

The first substrate can be a glass substrate, an opposite substrate, a color filter substrate, a thin-film-transistor array substrate, or an integrated substrate that integrates a color filter substrate and a thin-film-transistor array.

S102: forming multiple spacers on the first substrate, wherein, the multiple spacers include multiple main spacers and multiple auxiliary spacers, and a height of each main spacer and a height of each auxiliary spacer are the same.

Each of the multiple spacers can be made of various elastic materials such as an acrylic resin micro particle of a plastic material, a rod-shaped particle of a glass material or a spherical particle of a silicone material.

S103: providing a glass substrate, forming a material layer on a side of the glass substrate, and forming multiple concave slots at regions of the material layer corresponding to the multiple auxiliary spacers in order to form a second substrate.

The material layer can be various material layers such as a color resist layer or a common electrode layer which can be formed in the second substrate.

S104: aligning and assembling the first substrate having multiple spacers with the second substrate such that the multiple auxiliary spacers respectively face toward regions of the material layer which the multiple concave slots are located on, and the multiple main spacers respectively face toward regions of the material layer which the multiple concave slots are not located on in order to form the flat display panel. Wherein, when the flat display panel is not pressed, the flat display panel is supported by the main spacers, and when the flat display panel is pressed, the flat display panel is further supported through the auxiliary spacers.

When the first substrate and the second substrate are aligned and assembled, the multiple spacers formed on the first substrate face toward the second substrate in order to separate the first substrate and the second substrate, to maintain a distance between the first substrate and the second substrate of the flat display panel in order to form a room for filling liquid crystal molecules.

When a flat display panel is under a non-pressing status, the flat display panel is supported through the main spacers. At this time, the main spacers are under a compression status by a gravity force of the first substrate. The auxiliary spacers is under a non-compression status, that is, a free status, because the concave slots of the material layer on the second substrate are corresponding to the auxiliary spacers.

When the flat display panel is pressed, because the action of the pressure, the main spacers are further compressed. At the same time, the auxiliary spacers are respectively engaged and fixed in the multiple concave slots on the material layer such that the flat display panel is further supported. At this time, the auxiliary spacers are under a compression status.

In the manufacturing method for a flat display panel of the present invention, a height of each main spacer and a height of each auxiliary spacer are the same so that it is not required to manufacture spacers having different heights using a photomask technology using different light intensity. Besides, it is also not required to precisely control a level difference between a main spacer and an auxiliary spacer. The manufacture method of the flat display panel is simple and production cost is low so as to improve the economic benefits of a company and to be widely applied in a production process.

Furthermore, the first substrate is an opposite substrate, the second substrate is a thin film transistor array substrate, and the material layer is a color resist layer.

Furthermore, in the step S103, regions on the color resist layer corresponding to multiple auxiliary spacers are provided with multiple concave slots. Besides, one concave slot is provided at a location of the color resist layer corresponding to each sub-pixel so that a relationship of the auxiliary spacers and the color resist layer is that one sub-pixel corresponds to one auxiliary spacer.

It can be understood that in another embodiment, the step S103 further includes forming multiple concave slots on regions of the color resist layer corresponding to multiple auxiliary spacers and one concave slot is provided at a location of the color resist layer corresponding to multiple sub-pixels such that a relationship of auxiliary spacers and the color resist layer is that one sub-pixel corresponds to multiple auxiliary spacers.

Furthermore, the step S103 further includes disposing a height of each concave slot as h1, wherein, h1 is equal to Δh, and Δh is a height difference between a main spacer and an auxiliary spacer when the flat display panel is under a non-pressing status. Specifically, Δh is a height difference between a main spacer under a compression status and an auxiliary spacer under a non-compression status when the flat display panel is under the non-pressing status.

It can be understood that in another embodiment, the step S103 further includes disposing a height of each concave slot as h2, wherein, h2 is greater than Δh, Δh is a height difference between a main spacer and an auxiliary spacer when the flat display panel is under a non-pressing status.

In the manufacturing method for a flat display panel of the present invention, a height of each main spacer and a height of each auxiliary spacer are the same so that it is not required to manufacture spacers having different heights using a photomask technology using different light intensity. Besides, it is also not required to precisely control a level difference between a main spacer and an auxiliary spacer. The manufacture method of the flat display panel is simple and production cost is low so as to improve the economic benefits of a company and to be widely applied in a production process.

One concave slot is provided at a location of the color resist layer corresponding to each sub-pixel such that a relationship of the auxiliary spacers and the color resist layer is that one sub-pixel corresponds to an auxiliary spacer. Through above way, the manufacturing process is simplified, the production cost is decreased. Besides, when the flat display panel is compressed, that is the flat display panel is deformed and bent; the auxiliary spacers can be engaged and fixed in the concave slots such that the first substrate and the second substrate are not easily to slide relatively in order to avoid a light leakage of the flat display panel.

Besides, a height of each concave slot is greater than or equal to Δh, through this way, the auxiliary spacers have a supporting function only when the flat display panel is under a pressing status so as to avoid that the auxiliary spacers are under a compression status when the flat display panel is under a non-pressing status. Accordingly, the life of the auxiliary spacers is extended so as to extend the life of the flat display panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A flat display panel, comprising:
a first substrate;
a second substrate disposed oppositely to the first substrate, wherein, the second substrate is provided with a material layer, and multiple concave slots are disposed on the material layer; and
multiple spacers disposed on the first substrate and facing toward the second substrate in order to separate the first substrate and the second substrate;
wherein, multiple spacers include multiple main spacers and multiple auxiliary spacers; the multiple auxiliary spacers respectively face toward regions of the material layer which the multiple concave slots are located on, and the multiple main spacers respectively face toward regions of the material layer which the multiple concave slots are not located on; a height of each main spacer and a height of each auxiliary spacer are the same when the main spacer is not contacted with the material layer such that when the flat display panel is not pressed, supporting the flat display panel through the main spacers, and when the flat display panel is pressed, further supporting the flat display panel through the auxiliary spacers;
wherein, the first substrate is an opposite substrate, and the second substrate is a thin-film-transistor (TFT) array substrate; each spacer is made of an elastic material;
wherein each of the main spacer and the auxiliary spacer is compressible;
wherein each main spacer is contacted with the material layer, and each main spacer is compressed and under a compression status, and a height difference of Δh is formed between the main spacer and the auxiliary spacer, and the multiple auxiliary spacers are respectively engaged and fixed in the multiple concave slots;
wherein the height difference of Δh is a height difference between the main spacer under the compression status and the auxiliary spacer under a non-compression status;
wherein the material layer is a color resist layer; and
wherein one of multiple concave slots is provided at a location of the color resist layer corresponding to each sub-pixel.

2. The flat display panel according to claim 1, wherein, a height of each concave slot is h1; h1 is equal to Δh.

3. The flat display panel according to claim 1, wherein, a height of each multiple concave slots is h2, wherein, h2 is greater than Δh.

4. A flat display panel, comprising:
a first substrate;
a second substrate disposed oppositely to the first substrate, wherein, the second substrate is provided with a material layer, and multiple concave slots are disposed on the material layer;
multiple spacers disposed on the first substrate and facing toward the second substrate in order to separate the first substrate and the second substrate;
wherein, multiple spacers include multiple main spacers and multiple auxiliary spacers; the multiple auxiliary spacers respectively face toward regions of the material layer which the multiple concave slots are located on, and the multiple main spacers respectively face toward regions of the material layer which the multiple concave slots are not located on; a height of each main spacer and a height of each auxiliary spacer are the same when the main spacer is not contacted with the material layer such that when the flat display panel is not pressed, supporting the flat display panel through the main spacers, and when the flat display panel is pressed, further supporting the flat display panel through the auxiliary spacers;
wherein each of the main spacer and the auxiliary spacer is compressible;
wherein each main spacer is contacted with the material layer, and each main spacer is compressed and under a compression status, and a height difference of Δh is formed between the main spacer and the auxiliary spacer, and the multiple auxiliary spacers are respectively engaged and fixed in the multiple concave slots;
wherein the height difference of Δh is a height difference between the main spacer under the compression status and the auxiliary spacer under a non-compression status;

wherein the material layer is a color resist layer; and wherein one of multiple concave slots is provided at a location of the color resist layer corresponding to each sub-pixel.

5. The flat display panel according to claim 4, wherein, the first substrate is an opposite substrate, and the second substrate is a thin-film-transistor (TFT) array substrate.

6. The flat display panel according to claim 4, wherein, a height of each concave slot is h1; h1 is equal to $\Delta h$.

7. The flat display panel according to claim 4, wherein, a height of each multiple concave slots is h2, wherein, h2 is greater than $\Delta h$.

\* \* \* \* \*